United States Patent [19]

Amemiya

[11] Patent Number: 4,604,345

[45] Date of Patent: Aug. 5, 1986

[54] EXPOSURE METHOD

[75] Inventor: Mitsuaki Amemiya, Yokohama, Japan

[73] Assignee: Canon Kabushiki Kaisha, Tokyo, Japan

[21] Appl. No.: 729,051

[22] Filed: Apr. 30, 1985

[30] Foreign Application Priority Data

May 11, 1984 [JP] Japan ................................ 59-92893

[51] Int. Cl.[4] .............................................. G03C 5/00
[52] U.S. Cl. ...................................... 430/394; 430/967
[58] Field of Search ................................ 430/394, 967

[56] References Cited

U.S. PATENT DOCUMENTS

| | | | |
|---|---|---|---|
| 3,697,272 | 10/1972 | Ramins | 430/394 X |
| 3,888,672 | 6/1975 | Lee | 430/323 X |
| 4,256,829 | 3/1981 | Daniel | 430/967 X |
| 4,301,237 | 11/1981 | Burns | 430/967 X |
| 4,324,850 | 4/1982 | Tomita et al. | 430/394 X |
| 4,394,437 | 7/1983 | Bergendahl et al. | 430/394 X |
| 4,453,262 | 6/1984 | Buckley | 430/967 X |
| 4,454,209 | 6/1984 | Blais | 430/967 X |

*Primary Examiner*—John Kittle
*Assistant Examiner*—Mukund J. Sham
*Attorney, Agent, or Firm*—Fitzpatrick, Cella, Harper & Scinto

[57] ABSTRACT

An exposure method for exposing a sensitive layer on a semiconductor wafer to an integrated-circuit pattern of a mask. The exposure is effected by a combination of a primary exposure step for exposing the sensitive layer to the pattern with a beam of high resolution and a secondary exposure step for exposing the sensitive layer with a beam of lower resolution and by an amount which does not have a substantial effect on the sensitization of the sensitive layer. By the combined exposures, the exposure time can be reduced as compared with that required in the exposure only through a high-resolution exposure.

11 Claims, 8 Drawing Figures

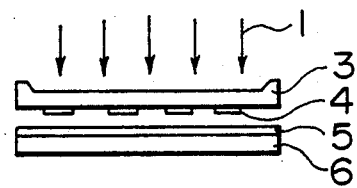
F I G. IA
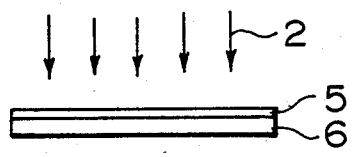
F I G. IB

EXPOSURE METHOD

BACKGROUND OF THE INVENTION

This invention relates to an exposure method and, more particularly, to a lithographic exposure method suitable for transferring an integrated-circuit pattern of a mask onto a semiconductor wafer having a radiation-sensitive coating, during the manufacture of semiconductor devices.

In conventional lithographic exposure for transferring, onto a wafer, a fine pattern of a photomask (which hereinafter will be referred to simply as "mask") for the manufacture of semiconductor devices or the like, the mask pattern is transferred onto the wafer only by a high-resolution exposure. That is, before or after such high-resolution exposure, no irradiation of a beam to which the radiation-sensitive layer on the wafer is sensitive is effected, for the sake of the pattern transfer.

It is known in the art that, for most radiation-sensitive materials for the radiation-sensitive layer on the wafer, the pattern transfer requires irradiation of the sensitizing beam of such an amount that is not less than a certain amount $D_0$ (threshold). Namely, if the amount of irradiation is less than the threshold $D_0$, there remains, after development, a layer thickness which is the same as the layer thickness that would remain where no irradiation or exposure is effected. Therefore, the irradiation of the sensitizing beam has to be continued until the amount of irradiation reaches the threshold $D_0$. As the result, a longer time is required for the exposure because the intensity is relatively low in the high-resolution exposure such as for the manufacture of semiconductor integrated circuits.

The term "beam" is referred to in this Specification to imply various kinds of beams such as ultraviolet rays, deep ultraviolet rays, X-rays, charged-particle rays, laser beams and so on. Among these beams, particularly the X-rays, when they are used in the exposure, require a very long exposure time. This is because the X-rays are divergent rays so that, in the X-ray exposure, the mask is located at a position far remote from an X-ray source in order to improve the degree of parallelism of the X-rays impinging on the mask. Alternatively, an X-ray collimator is used to extract only parallel components out of the diverging X-rays. In any case, the intensity is very low in the case of X-ray exposure, which necessarily requires a prolonged exposure time.

SUMMARY OF THE INVENTION

It is accordingly a primary object of the present invention to provide an exposure method which allows reduction in the exposure time.

It is another object of the present invention to provide an exposure method suitable for transferring a pattern onto a radiation-sensitive layer with the use of X-rays.

Briefly, according to the present invention, there is provided an exposure method in which a radiation-sensitive layer is exposed to a pattern by a combination of a primary exposure step for exposing, with a high resolution, the radiation-sensitive layer to the pattern and a secondary exposure step for exposing the sensitive layer by an amount that would not substantially affect the exposure or sensitization of the sensitive layer. By this, the exposure time can be reduced even if the exposure is effected with a low-intensity beam, such as in the case of X-ray exposure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic views, respectively, illustrating an exposure method according to an embodiment of the present invention.

DESCRIPTION OF THE PREFERRED EMBODIMENTS

Figure 2A:
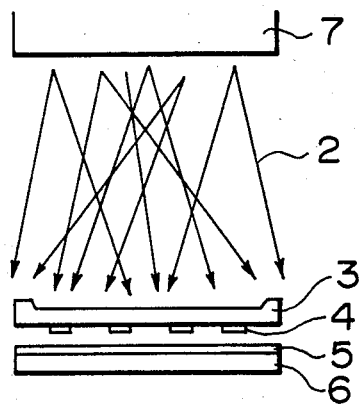
FIGS. 2A–2C are schematic views, respectively, illustrating an exposure method according to another embodiment of the present invention.

FIGS. 1A and 1B schematically illustrate an exposure method according to an embodiment of the present invention. Briefly, according to this embodiment of the present invention, the exposure is effected by a combination of a primary exposure step, of high resolution, and a secondary exposure. In FIGS. 1A and 1B, a reference numeral 1 denotes a beam used in the primary exposure of high resolution, and a reference numeral 2 denotes a beam used in the secondary exposure. While both the beams 1 and 2 are required to be sensitizable relative to the material of a sensitive layer 5, it is not necessary that the beams 1 and 2 have exactly the same characteristics. Denoted by a reference numeral 3 is a mask having formed thereon an integrated-circuit pattern 4 which is to be transferred onto the sensitive layer 5 applied to a semiconductor wafer 6.

The primary exposure step is illustrated in FIG. 1A, wherein the beam 1 of high resolution is applied to the wafer 6 through the mask 3 having the pattern 4. On the other hand, the secondary exposure step is illustrated in FIG. 1B, wherein the beam 2 is applied, without using the mask 3, to the entire surface of or to a desired portion of the surface of the sensitive layer 5 by a suitable amount which is less than the above-described threshold $D_0$. The threshold $D_0$ is determined in dependence on the material of the sensitive layer and/or a developing agent used. This secondary exposure is effected before or after the primary exposure step. Of course, the secondary exposure may be effected both before and after the primary exposure step. With the combination of the primary exposure step and the secondary exposure step, the pattern 4 of the mask 3 is transferred onto the wafer 6.

The amount of irradiation, during the secondary exposure step, which does not substantially expose or sensitize the sensitive layer 5 is determined in dependence upon the material of the sensitive layer 5, the kind of the developing agent, the sensitivity of the sensitive layer to the beam 2 and so on.

The beams 1 and 2 may be ones emitted from a common source, or alternative, may be ones emitted from separate sources. The beams 1 and 2 may be of the same kind, or alternatively, of different kinds. For example, the beam 1 may consist of an electron beam, whereas the beam 2 may consist of X-rays.

If, as described in the foregoing, the exposure is effected only with an amount of irradiation less than the threshold $D_0$, such as in the secondary exposure step (FIG. 1B), there remains on the wafer, after development, a layer thickness the same as the layer thickness that would remain where no irradiation of the sensitizing beam is effected. However, when the sum of the amount of irradiation during the high-resolution primary exposure step (FIG. 1A) and the amount of irradiation during the secondary exposure step (FIG. 1B) reaches the threshold $D_0$, the sensitive layer 5 is selectively sensitized. More specifically, only such portion of the sensitive layer 5 that has been irradiated, during the primary exposure step (FIG. 1A), by the sensitizing beam 1 which has passed through the mask 3 is sensitized. In other words, the area on the sensitive layer 5 exposed to the sensitizing beam 1, which has not intercepted by the mask 3 or the pattern 4, is sensitized. The remaining portion of the sensitive layer 5 is not sensitized, since the amount of irradiation in such portion is that provided only by the secondary exposure step (FIG. 1B) which amount is less than the threshold $D_0$.

By this, a fine pattern is reproduced on the wafer 6 with high resolution, which pattern is then visualized by the developing process.

According to conventional exposure method, the exposure is effected only by a high-resolution exposure step such as the primary exposure step (FIG. 1A) of the present invention. Therefore, a long exposure time is necessary. According to the present invention, as compared therewith, the exposure is effected by the combination of the high-resolution primary exposure step with the secondary exposure step. The efficiency of the secondary exposure is high because the secondary exposure step does not require a high resolution such as in the primary exposure step. As the result, the exposure time, i.e. the time required for the combined primary exposure step and secondary exposure step, can be reduced as compared with that in the conventional exposure method. If the sensitizing beam 2 used in the secondary exposure step (FIG. 1B) has the characteristic to which the material of the sensitive layer 5 shows a higher sensitivity, or if a higher luminance beam is used as the beam 2, further reduction in the exposure time is possible.

Figure 2B:
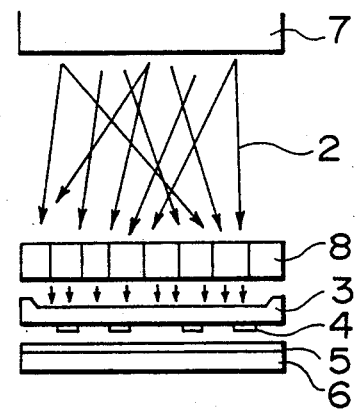
Figure 2C:
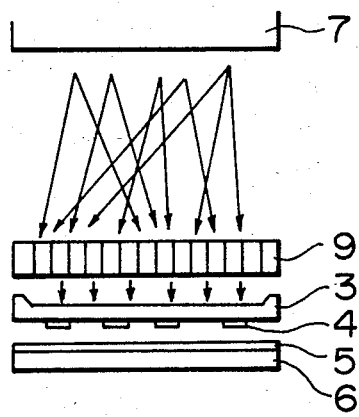

Referring to FIGS. 2A–2C, an exposure method according to another embodiment of the present invention will now be described.

In FIGS. 2A–2C, the same reference numerals as in the preceding embodiment are assigned to the elements having corresponding functions. Reference numeral 7 denotes a plane radiation source for supplying a beam such as, for example, X-rays, to which the material of a sensitive layer 5 is sensitive. Reference numerals 8 and 9 denote solar slits, respectively. Each of the solar slits 8 and 9 functions as a collimator for extracting a parallel component out of the X-rays divergingly emitted from the source 7. The solar slit 8 has a smaller aperture ratio so that the resolution thereof is relatively low. On the other hand, the solar slit 9 has a larger aperture ratio so that the resolution thereof is relatively high.

According to this embodiment of the present invention, the exposure is effected by the combination of a high-resolution primary exposure step as illustrated in FIG. 2C and a lower-resolution secondary exposure step as illustrated in FIG. 2A or FIG. 2B. In the high-resolution primary exposure step (FIG. 2C), the mask 3 and the wafer 6 (sensitive layer 5) are irradiated with X-rays of high resolution obtained through the high-resolution solar slit 9. On the other hand, the secondary exposure of lower resolution is effected without using any solar slit (as in the case of FIG. 2A), or with the use of the solar slit 8 of lower resolution (as in the case of FIG. 2B).

While the exposure efficiency in the FIG. 2B exposure step using the solar slit 8 of lower resolution is in fact lower than that in the FIG. 2A exposure step using no solar slit, the efficiency of the FIG. 2B case is still higher than that in the primary exposure step (FIG. 2C), because the resolution of the solar slit 9 used in the primary exposure step is higher than that of the solar slit 8 used in the secondary exposure step. Therefore, the combination of the high-resolution primary exposure step (FIG. 2C) with either of two kinds of secondary exposure steps as illustrated in FIGS. 2A and 2B effectively reduces the exposure time for transferring the fine pattern 4 onto the wafer 6.

Figure 3:
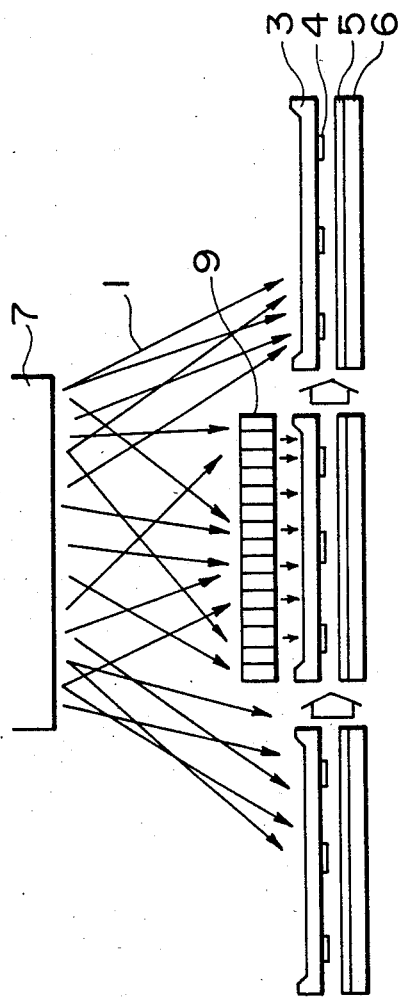
FIG. 3 is a schematic view illustrating an exposure method according to a further embodiment of the present invention.

Referring now to FIG. 3, an exposure method according to a third embodiment of the present invention will be described. In FIG. 3, the same reference numerals as in the foregoing embodiments are assigned to elements having corresponding functions.

According to this embodiment of the present invention, the exposure is effected by a combination of a high-resolution primary exposure step with two secondary exposure steps. In the primary exposure step, a solar slit 9 of high resolution is used to obtain an exposure beam of high resolution. On the other hand, neither of the two secondary exposure steps uses such solar slit means. One of the two secondary exposure steps is effected prior to the primary exposure step, so that it is a pre-exposure. The other of the secondary exposure steps is effected after the primary exposure step, so that it is a post-exposure. Accordingly, the exposure of the wafer 6 is effected in the order of the first secondary exposure step (pre-exposure), the primary exposure step of high resolution and the second secondary exposure step (post-exposure). Such sequential exposures are effected relative to the wafer 6, while moving as a unit the mask 3 and the wafer 6 continuously or intermittently.

Figure 4A:
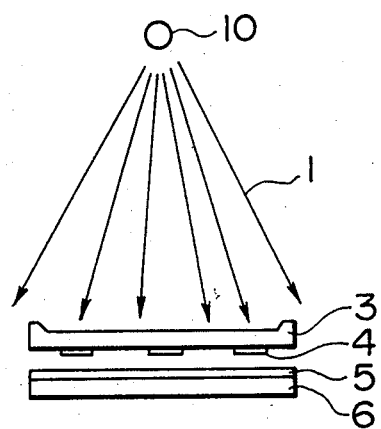
FIGS. 4A and 4B are schematic views, respectively, illustrating an exposure method according to a still further embodiment of the present invention.
Figure 4B:
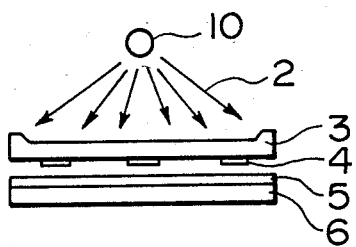

Referring to FIGS. 4A and 4B, an exposure method according to a further embodiment of the present invention will now be described. In these Figures, the same reference numerals as in the foregoing embodiments are assigned to the elements having corresponding functions.

Similarly to the embodiments described in the foregoing, the exposure is effected according to this embodiment of the present invention by a combination of a high-resolution primary exposure step with a secondary exposure step. However, in this embodiment, the interchange of the primary exposure step and the secondary exposure step is achieved by changing the distance between a point radiation source 10 and a mask 3 (or a wafer 6 having a sensitive layer 5). More specifically, in the primary exposure step (FIG. 4A), the mask 3 and the wafer 6 located in proximity to the mask 3 and having the sensitive layer 5 are irradiated by a beam 1 generated from the point radiation source 10, while maintaining a sufficient distance between the point light source 10 and the mask 3 (or the wafer 6) for achieving a desired resolution necessary for transferring a fine pattern 4 satisfactorily. In the secondary exposure step (FIG. 4B), on the other hand, the point light source 10 is moved relative to the mask 3 to reduce the distance therebetween, and the mask 3 and the wafer 6 are irradiated by a beam 2 produced by the point light source 10. During this irradiation, either of or both of the mask 3 and the wafer 6 may be vibrated. Of course, the mask 3 and the wafer 6 may be kept stationary. Since the distance between the point light source 10 and the wafer 6 is reduced, a higher illuminance is achieved on the wafer 6 surface. This allows reduction in the exposure time. The secondary exposure step may of course be effected both before and after the primary exposure step, as in the FIG. 3 embodiment.

While, in each of the embodiments described with reference to FIGS. 2A–4B, the mask 3 is used also in the secondary exposure step. However, as in the secondary exposure step of the first embodiment, shown in FIG. 1B, the entire surface of the wafer may be irradiated during the secondary exposure step, without using the mask. In such case, it is not a requisition that the amount of irradiation is uniform over the entire wafer surface, unless the amount at each point on the wafer surface is kept within a predetermined range.

In accordance with the present invention, as has hitherto been described, the exposure time required for transferring a pattern onto a sensitive layer can be reduced significantly. Depending on the conditions, it is possible to reduce the exposure time to a half or less of that required in the conventional exposure method.

While the invention has been described with reference to the structures disclosed herein, it is not confined to the details set forth and this application is intended to cover such modifications or changes as may come within the purposes of the improvements or the scope of the following claims.

What is claimed is:

1. A method of transferring a pattern of a first object onto a radiation-sensitive layer of a second object by exposing the radiation-sensitive layer to radiation, said method comprising:

a primary exposure step for exposing, with a higher resolution, the radiation-sensitive layer to radiation through the pattern of the first object; and a secondary exposure step for exposing the radiation-sensitive layer to radiation by an amount which does not have a substantial effect on the radiation-sensitive layer;

wherein the primary step and the secondary step, when combined, are effective to transfer the pattern of the first object onto the radiation-sensitive layer of the second object.

2. A method according to claim 1, wherein the secondary step is carried out prior to the primary step.

3. A method according to claim 1, wherein the secondary step is carried out after the primary step.

4. A method according to claim 1, wherein the secondary step is carried out prior to and after the primary step.

5. A method according to claim 1, wherein the sensitive layer is exposed to the pattern during the primary step with an X-ray.

6. A method according to claim 5, wherein the sensitive layer is exposed to the pattern during the secondary step with an X-ray having an intensity greater than that of the X-ray used in the primary step.

7. A method according to claim 6, wherein the primary step and the secondary step are interchanged by means of a solar slit.

8. A method according to claim 6, wherein the primary step and the secondary step are interchanged by changing a relative position of a source supplying the X-ray.

9. A method according to claim 1, wherein the primary step and the secondary step use X-rays, respectively, emitted from a common source.

10. A method according to claim 9, wherein the primary step uses the X-ray passed through a solar slit.

11. A method according to claim 10, wherein the secondary step uses the X-ray passed through a solar slit having a smaller aperture ratio as compared with that of the solar slit used in the primary step.

* * * * *